United States Patent
Yang et al.

(10) Patent No.: US 10,388,349 B2
(45) Date of Patent: Aug. 20, 2019

(54) WRITING OF A MAGNETIC MEMORY WITH ELECTRIC PULSES

(71) Applicant: THE REGENTS OF THE UNIVERSITY OF CALIFORNIA, Oakland, CA (US)

(72) Inventors: Yang Yang, Berkeley, CA (US); Jon Gorchon, Berkeley, CA (US); Richard Brian Wilson, Riverside, CA (US); Charles Henri Alexandre Lambert, Berkeley, CA (US); Sayeef Salahuddin, Berkeley, CA (US); Jeffrey Bokor, Piedmont, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/711,726

(22) Filed: Sep. 21, 2017

(65) Prior Publication Data
US 2019/0088300 A1    Mar. 21, 2019

(51) Int. Cl.
*G11C 11/16* (2006.01)
*H01L 43/10* (2006.01)
*H01L 43/08* (2006.01)

(52) U.S. Cl.
CPC ........ *G11C 11/1675* (2013.01); *G11C 11/161* (2013.01); *G11C 11/1673* (2013.01); *H01L 43/08* (2013.01); *H01L 43/10* (2013.01)

(58) Field of Classification Search
CPC ........ G11C 11/161; H01L 43/08; H01L 43/10
USPC ....................................................... 365/158
See application file for complete search history.

(56) References Cited

U.S. PATENT DOCUMENTS

| | | | | |
|---|---|---|---|---|
| 2004/0095801 | A1* | 5/2004 | Stipe ..................... | B82Y 10/00 365/158 |
| 2014/0056060 | A1* | 2/2014 | Khvalkovskiy ....... | H01L 27/228 365/158 |
| 2017/0069829 | A1* | 3/2017 | Morise ................... | H01L 43/02 |
| 2017/0263859 | A1* | 9/2017 | Tang ...................... | H01L 43/10 |
| 2018/0096792 | A1* | 4/2018 | Shukh .................... | H01G 4/30 |

OTHER PUBLICATIONS

Åkerman, J., "Toward a Universal Memory," Science, vol. 308, Apr. 22, 2005, 4 pages.
Author Unknown, "Memory with a spin," Nature Nanotechnology, vol. 10, Mar. 2015, 1 page.
Beaurepaire, E., et al., "Ultrafast Spin Dynamics in Ferromagnetic Nickel," Physical Review Letters, vol. 76, No. 22, May 27, 1996, 4 pages.
Behin-Aein, B., et al., "Proposal for an all-spin logic device with built-in memory," Nature Nanotechnology, vol. 5, Feb. 28, 2010, 5 pages.

(Continued)

*Primary Examiner* — Fernando Hidalgo
(74) *Attorney, Agent, or Firm* — Withrow & Terranova, P.L.L.C.

(57) ABSTRACT

Methods and memory circuits for altering a magnetic direction of a magnetic memory cell using picosecond electric current pulses are disclosed. One method includes directing a first electric current pulse through the magnetic memory cell that includes a ferromagnetic material layer to heat the ferromagnetic material layer to toggle a magnetic direction of the ferromagnetic material layer from a first magnetic direction to a second magnetic direction.

29 Claims, 6 Drawing Sheets

(56) References Cited

OTHER PUBLICATIONS

Chen, E., et al., "Characteristics of Coplanar Transmission Lines on Multilayer Substrates: Modeling and Experiments," IEEE Transactions on Microwave Theory and Techniques, vol. 45, No. 6, Jun. 1997, 7 pages.
Chen, J.-Y., et al., "Picosecond all-optical switching of magnetic tunnel junctions," Physical Review Applied, vol. 1, No. 021001, Jul. 2016, 17 pages.
Cubukcu, M., et al., "Ultra-fast perpendicular Spin Orbit Torque MRAM," SPIE Proceedings vol. 9551, Oct. 5, 2015, 15 pages.
Gambardella, P., "Introduction to spin torques and spin-orbit torques in metal layers," Spin Mechanics III Vorkshop, Jun. 22-26, 2015, Munich, Germany, 87 pages.
Garello, K., et al., "Ultrafast magnetization switching by spin-orbit torques," Applied Physics Letters, vol. 105, No. 212402, Nov. 24, 2014, 5 pages.
Gerrits, T., et al., "Ultrafast precessional magnetization reversal by picosecond magnetic field pulse shaping," Nature, vol. 418, Aug. 1, 2002, 4 pages.
Gorchon, J., et al., "The role of electron and phonon temperatures in the helicity-independent all-optical switching of GdFeCo," Physical Review B, vol. 94, Nov. 4, 2016, 18 pages.
Gupta, S., et al., "Subpicosecond carrier lifetime in GaAs grown by molecular beam epitaxy at low temperatures," Applied Physics Letters, vol. 59, No. 25, Dec. 16, 1991, 3 pages.
Hohlfeld, J., et al., "Fast magnetization reversal of GdFeCo induced by femtosecond laser pulses," Physical Review B, vol. 65, No. 012413, Dec. 5, 2001, 4 pages.
Kent, A. D., "A new spin on magnetic memories," Nature Nanotechnology, vol. 10, Mar. 2015, 5 pages.
Ketchen, M.B., et al., "Generation of subpicosecond electrical pulses on coplanar transmission lines," Applied Physics Letters, vol. 48, No. 12, Mar. 24, 1986, 3 pages.
Kirilyuk, A., et al., "Ultrafast optical manipulation of magnetic order," Reviews of Modem Physics, vol. 82, Jul.-Sep. 2010, 54 pages.
Koopmans, B., et al., "Explaining the paradoxical diversity of ultrafast laser-induced demagnetization," Nature Materials, vol. 9, Dec. 13, 2009, 7 pages.
Liu, H. et al., "Ultrafast switching in magnetic tunnel junction based orthogonal spin transfer devices," Applied Physics Letters, vol. 97, No. 242510, Dec. 17, 2010, 3 pages.
Matsukura, F., "Control of magnetism by electric fields," Nature Nanotechnology, vol. 10, Mar. 2015, 12 pages.
Mistry, K., et al., "A 45nm Logic Technology with High-k+Metal Gate Transistors, Strained Silicon, 9 Cu Interconnect Layers, 193nm Dry Patterning, and 100% Pb-free Packaging," IEEE International Electron Devices Meeting, Dec. 10-12, 2007, Washington, D.C., USA, 4 pages.
Ostler, T.A., et al., "Ultrafast heating as a sufficient stimulus for magnetization reversal in a ferrimagnet," Nature Communications, vol. 3, No. 666, Feb. 7, 2012, 6 pages.
Radu, I., et al., "Transient ferromagnetic-like state mediating ultrafast reversal of antiferromagnetically coupled spins," Nature, vol. 472, Apr. 14, 2011, 5 pages.
Stanciu, C.D., et al., "All-Optical Magnetic Recording with Circularly Polarized Light," Physical Review Letters, vol. 99, Jul. 25, 2007, 4 pages.
Stanciu, C.D., et al., "Subpicosecond Magnetization Reversal across Ferrimagnetic Compensation Points," Physical Review Letters, vol. 99, No. 217204, Nov. 19, 2007, 4 pages.
Tas, G., et al., "Electron diffusion in metals studied by picosecond ultrasonics," Physical Review B, vol. 49, No. 21, Jun. 1, 1994, 9 pages.
The International Technology Roadmap for Semiconductors: 2013 Edition, IRC Overview, Available online at: <http://www.itrs2.net/2013-itrs.html>, 34 pages.
Wilson, R.B., et al., "Electric Current Induced Ultrafast Demagnetization," Physical Review B, vol. 96, Sep. 2, 2016, 30 pages.
Wilson, R.B., et al., "Ultrafast Magnetic Switching of GdFeCo with Electronic Heat Currents," Physical Review B, vol. 95, Sep. 16, 2016, 17 pages.
Zeng, Z.M., et al., "Effect of resistance-area product on spin-transfer switching in MgO-based magnetic tunnel junction memory cells," Applied Physics Letters, vol. 98, No. 072512, Feb. 18, 2011, 3 pages.
Zhao, H., et al., "Sub-200 ps spin transfer torque switching in in-plane magnetic tunnel junctions with interface perpendicular anistropy," Journal of Physics D: Applied Letters, vol. 45, Dec. 20, 2011, 5 pages.
Žutić, I., et al., "Spintronics: Fundamentals and applications," Reviews of Modem Physics, vol. 76, Apr. 2004, 88 pages.

* cited by examiner

WRITING OF A MAGNETIC MEMORY WITH ELECTRIC PULSES

GOVERNMENT RIGHTS

This invention was made with government funds under Agreement No. HR0011-13-3-0002 awarded by The Defense Advanced Research Projects Agency (DARPA) and Contract No. DE-AC02-05CH11231 awarded by the U.S. Department of Energy. The U.S. Government has certain rights in this invention.

TECHNICAL FIELD

The embodiments relate to magnetic memory and, in particular, to storing a value in a magnetic memory cell using an electric pulse.

BACKGROUND

A conventional random access memory (RAM) is an electric charge based device. A conventional RAM is volatile and cannot store data if power is turned off. In contrast, a magnetoresistive random access memory (MRAM) is a magnetic field based device, is non-volatile, and utilizes less power than a conventional RAM.

An MRAM utilizes a difference in magnetic directions between two plates in an MRAM bit cell to store data. One plate in an MRAM bit cell is "pinned," such that the magnetic direction is permanent. The other plate in the MRAM bit cell is "free," and the magnetic direction of the free plate is changed to be parallel or anti-parallel to that of the pinned plate depending on the desired value of the MRAM bit cell.

If the two plates in an MRAM bit cell have the same magnetic direction, the electrical resistance of the MRAM bit cell is less than if the two plates have opposite magnetic directions. Values, such as a one or a zero may be assigned to the different levels of resistance. The electric resistance of an MRAM bit cell is measured to determine whether the MRAM bit cell has been set to a value of one or a value of zero.

The magnetic direction of the free plate is changed via a spin-polarized current passed adjacent to the free layer of the MRAM bit cell. Such devices are sometimes referred to as spin-electronic devices, or spintronic devices. Spintronic devices include, for example, spin-transfer torque (STT) and spin-orbit torque (SOT) magnetic memories.

A significant obstacle that impedes the widespread adoption of spintronic devices is their speed. The speed of a spintronic device, such as an STT or SOT memory, is limited by the switching time of the magnetization of the magnetic medium. Switching times of magnetic materials are typically on the order of hundreds of picoseconds (ps). For comparison, a metal-oxide-semiconductor field-effect transistor (MOSFET) transistor can have a switching delay as short as 5 ps. Thus, in order for magnetic-based memories to challenge charge-based memories in information technologies, it would be desirable to dramatically reduce the time it takes to write data to a magnetic bit cell.

SUMMARY

The embodiments relate to a method for setting a value of a magnetic memory cell using an electric pulse. The embodiments greatly reduce the read and write times of a magnetic memory cell. For example, the embodiments facilitate writing successive values to a magnetic memory cell in less than 10 picoseconds.

In one embodiment a method for altering a magnetic direction of a magnetic memory cell from a first magnetic direction to a second magnetic direction is provided. The method includes directing a first electric current pulse through the magnetic memory cell that comprises a ferrimagnetic material layer to heat the ferrimagnetic material layer to toggle a magnetic direction of the ferrimagnetic material layer from the first magnetic direction to the second magnetic direction.

In another embodiment a memory circuit is provided. The memory circuit includes a magnetic memory cell that includes a ferrimagnetic material layer. The memory circuit also includes an electric circuit that is coupled to the magnetic memory cell. The electric circuit is configured to generate and direct a first electric current pulse through the magnetic memory cell to heat the ferrimagnetic material layer to toggle a magnetic direction of the ferrimagnetic material layer from a first magnetic direction to a second magnetic direction.

In another embodiment a method for setting a magnetic direction associated with a magnetic memory cell to a first magnetic direction or a second magnetic direction is provided. The method includes receiving a first instruction to set the magnetic direction associated with the magnetic memory cell to the first magnetic direction, the magnetic memory cell comprising a ferrimagnetic material layer and a spin-torque layer thermally coupled to the ferrimagnetic material layer. The method further includes sending, from a first direction with respect to the magnetic memory cell, a first electric current pulse through the spin-torque layer to generate a first magnetic torque on the ferrimagnetic material layer and to heat the ferrimagnetic material layer to set a magnetic direction of the ferrimagnetic material layer to the first magnetic direction.

In yet another embodiment, another memory circuit is provided. The memory circuit includes a magnetic memory cell that includes a ferrimagnetic material layer having a magnetic direction. The memory circuit also includes a spin-torque layer thermally coupled to the ferrimagnetic material layer. The memory circuit also includes an electric circuit that is electrically coupled to the spin-torque layer. The electric circuit is configured to generate and send an electric current pulse through the spin-torque layer from a particular direction with respect to the magnetic memory cell to generate a magnetic torque on the ferrimagnetic material layer and to heat the ferrimagnetic material layer to set the magnetic direction of the ferrimagnetic material layer to a desired magnetic direction.

Those skilled in the art will appreciate the scope of the disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Figure 1:
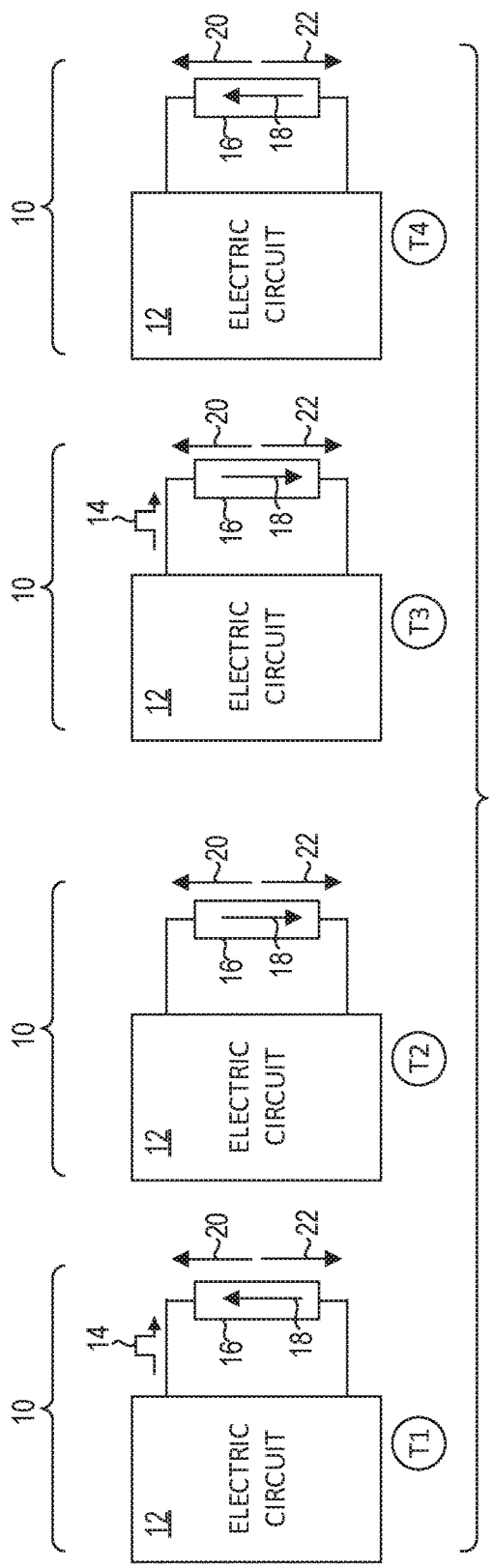
FIG. 1 illustrates block diagrams of a memory circuit at four different instances in time T1-T4 according to one embodiment.

The embodiments set forth below represent the information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the embodiments are not limited to any particular sequence of steps. The use herein of ordinals in conjunction with an element is solely for distinguishing what might otherwise be similar or identical labels, such as "first magnetic direction" and "second magnetic direction," and does not imply a priority, a type, an importance, or other attribute, unless otherwise stated herein. The term "about" used herein in conjunction with a numeric value means any value that is within a range of ten percent greater than or ten percent less than the numeric value.

As used herein and in the claims, the articles "a" and "an" in reference to an element refers to "one or more" of the element unless otherwise explicitly specified.

References to "magnetic direction" herein refer to the direction component of the dipole moment associated with a respective ferrimagnetic layer of a magnetic memory cell. The current magnetic direction of a ferrimagnetic layer of a magnetic memory cell will be represented by an arrow throughout the drawings.

The driving force behind all-optical switching (AOS) of ferrimagnetic metals is ultrafast heating of the electronic system. Ferrimagnets such as GdFeCo contain two distinct spin sublattices aligned antiparallel to each other with uncompensated magnetic moments. Picosecond switching is understood as due to the distinct dynamics of the Gd and the FeCo sublattices. First, the magnetic sublattices undergo demagnetization at different rates after laser excitation. Then, angular momentum exchange between sublattices enables a transient alignment of the two sublattices, followed by picosecond magnetization reversal.

The embodiments utilize picosecond (ps) electric charge current pulses to excite the electrons of a ferrimagnetic material, such as a GdFeCo metal film. The embodiments facilitate repeatable ultrafast magnetization reversal in the GdFeCo film with single sub-10 ps electrical pulse excitation.

The electrical heating results in a large population of excited electrons with average energies less than 10 millielectronvolts (meV), while optical heating initially excites a much smaller number of electrons with eV scale energies. The ability to induce magnetization reversal in GdFeCo by picosecond electrical heating demonstrates that exciting a nonthermal electron distribution is not necessary for magnetization reversal.

Electrical heating of GdFeCo shows strong potential for high endurance. In experiments conducted by the inventors named herein, no degradation of electrical or magnetic properties has been observed after more than 10 hours of pump-probe experiments, which were performed with a laser repetition rate of 252 kHz. Ten hours of experiments corresponds to more than 1010 cycles. A lifetime in excess of 1010 cycles is many orders of magnitude higher than most resistive RAM, phase-change memory or conductive bridging RAM.

The embodiments utilize picosecond electrical heating by charge current injection to reverse magnetic order/direction efficiently, yet more than one order of magnitude faster than any other current induced method. The embodiments reduce the switching times of ferrimagnetic materials by a factor of 10 or more, and thus facilitate extremely fast magnetic memories in comparison to conventional magnetic memories.

In some embodiments, a picosecond electrical pulse that lacks spin polarization is passed through a memory cell comprising a ferrimagnetic material layer to heat the ferrimagnetic material layer to toggle a magnetic direction of the ferrimagnetic material layer from a first magnetic direction to a second magnetic direction. In other embodiments, a picosecond electrical pulse is passed through a spin torque layer that is thermally coupled to a ferrimagnetic material layer to generate a first magnetic torque on the ferrimagnetic material layer and to heat the ferrimagnetic material layer to set the magnetic direction of the ferrimagnetic material layer to a desired magnetic direction.

A first magnetic direction of a magnetic memory cell may be assigned one value, such as a zero, and the second magnetic direction of the ferrimagnetic memory cell may be assigned another one value, such as a one. The magnetic direction of the magnetic memory cell may subsequently be read to obtain the stored value.

FIG. 1 illustrates block diagrams of a memory circuit 10 at four different instances in time T1-T4, according to one embodiment. At the time T1, an electric circuit 12 generates an electric current pulse 14 that lacks spin polarization and sends the electric current pulse 14 through a magnetic memory cell 16 that has an associated magnetic direction 18 that points in a first direction 20. The first direction 20 may be associated with a numeric value of one, for example.

The electric circuit 12 may comprise any single electrical component or combination of electrical components suitable for generating an electric current pulse of a duration and current density as discussed herein. The phrase "lacks spin polarization" means that the electric current pulse is passed through the magnetic memory cell 16 without spin polarization. The electric current pulse 14 may be a pulse of about 50 ps at full width half maximum (FWHM), or about 20 ps FWHM, or about 10 ps FWHM, or any duration between about 0.1 ps and 50 ps. In some embodiments, the electric current pulse 14 may have a current density up to about $10^9$ A/cm$^2$. In some embodiments, the electric current pulse 14 deposits about 1.4 mJ/cm$^2$ into the magnetic memory cell 16. In some embodiments, the electric current pulse duration may be longer than 50 ps, and the current density may be lower. While the electric current pulse 14 is illustrated as moving in a second direction 22 with respect to the magnetic memory cell 16, in this embodiment, the direction of the electric current pulse 14 is not important, and could be sent in the first direction 22 with respect to the magnetic memory cell 16.

The magnetic memory cell 16 includes a ferrimagnetic material layer. The ferrimagnetic material layer may comprise, for example, a single layer or multi-layer ferrimagnetic nanomagnet. The ferrimagnetic material layer may comprise, for example, a single layer of a GdFeCo alloy. In another embodiment, the ferrimagnetic material layer may comprise, for example, a Ta(5 nm)/Gd$_{30}$Fe$_{63}$Co$_7$(20 nm)/Pt(5 nm) multilayer. The ferrimagnetic material layer may comprise any suitable rare-earth transition metal ferrimagnetic materials, including alloys, and/or layered films, such as, by way of non-limiting example, gadolinium iron cobalt, terbium iron, or terbium cobalt.

In some embodiments, the electric current pulse 14 deposits about 1.4 mJ/cm$^2$ into the magnetic memory cell 16. In one embodiment, the magnetic memory cell 16 has a cell size of 20 nm$^3$, and the electric current pulse 14 has a peak current of about 3 mA that delivers about 4 fJ of energy to the magnetic memory cell 16.

At the time T2, immediately after the sending of the electric current pulse 14, such as 10 ps later, the magnetic direction 18 has toggled to point in the second direction 22. The second direction 22 may be associated with a value of zero, for example. Each electric current pulse 14 injected into the magnetic memory cell 16 toggles the magnetic direction 18 from one direction to the other direction.

The electric circuit 12 may be instructed to set the value of the magnetic memory cell 16 to one. The electric circuit 12 may first read the magnetic memory cell 16 to determine the current value of the magnetic memory cell 16. Unlike conventional spin-orbit torque (SOT) magnetic memories, the electric circuit 12 may read the magnetic memory cell 16 shortly after toggling the magnetic direction 18, such as 5 ps to 50 ps later, due to the ultrashort switching time of the magnetization of the ferrimagnetic material layer facilitated by the embodiments herein.

After determining that the current value of the magnetic memory cell 16 is zero (i.e., the magnetic direction 18 is in the second direction 22), at a time T3, the electric circuit 12 generates an electric current pulse 14 that lacks spin polarization and sends the electric current pulse 14 through the magnetic memory cell 16. The time T3 may be almost immediately after the time T1, such as, for example, between 5 picoseconds and less than 50 picoseconds after the time T1 due to the ultra-short switching time of the magnetization of the ferrimagnetic material layer facilitated by the embodiments herein.

At the time T4, immediately after the sending of the electric current pulse 14 into the magnetic memory cell 16, such as 10 ps later, the magnetic direction 18 has toggled to point in the first direction 20.

Figure 2:
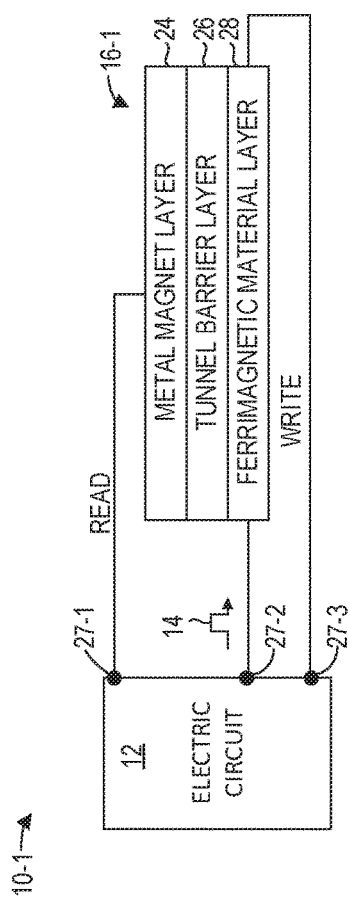
FIG. 2 is a block diagram of a memory circuit according to one embodiment.

FIG. 2 illustrates a memory circuit 10-1 according to one embodiment. The memory circuit 10-1 is substantially similar to the memory circuit 10 discussed above with regard to FIG. 1, except as noted herein. The memory circuit 10-1 includes a magnetic memory cell 16-1 that includes a metal magnet layer 24, a tunnel barrier layer 26 and a ferrimagnetic material layer 28. The metal magnet layer 24 has a static magnetic direction that is "pinned" such that the magnetic direction of the metal magnet layer 24 does not change. The tunnel barrier layer 26 comprises a thin insulating layer between the metal magnet layer 24 and the ferrimagnetic material layer 28. The metal magnet layer 24 and the tunnel barrier layer 26 may comprise materials utilized in conventional magnetoresistive random access memory (MRAM) memory cells. The ferrimagnetic material layer 28 may comprise any of the ferrimagnetic materials discussed above with regard to FIG. 1, including, by way of non-limiting example, a rare-earth transition metal ferrimagnetic material, including alloys, and/or layered films, such as, for example, gadolinium iron cobalt, terbium iron, or terbium cobalt.

The electric circuit 12 has three terminals 27-1, 27-2 and 27-3, and sends the electric current pulse 14 through the ferrimagnetic material layer 28 via terminals 27-2 and 27-3. In this embodiment, the electric current pulse 14 may be sent in either direction through the ferrimagnetic material layer 28, such as in a direction from the terminal 27-2 to the terminal 27-3, or from the terminal 27-3 to the terminal 27-2. The electric current pulse 14 causes the ferrimagnetic material layer 28 to heat and to toggle a magnetic direction of the ferrimagnetic material layer 28 from a first magnetic direction to a second magnetic direction.

Similar to a conventional MRAM cell, the electric circuit 12 can determine the current magnetic direction of the ferrimagnetic material layer 28, and thus the value of the magnetic memory cell 16-1, based on an electrical resistance between the terminals 27-1 and 27-2. It will be noted that the memory circuit 10-1 has been simplified for purposes of illustration, and may include additional layers found in conventional MRAM memory cells.

Figure 3:
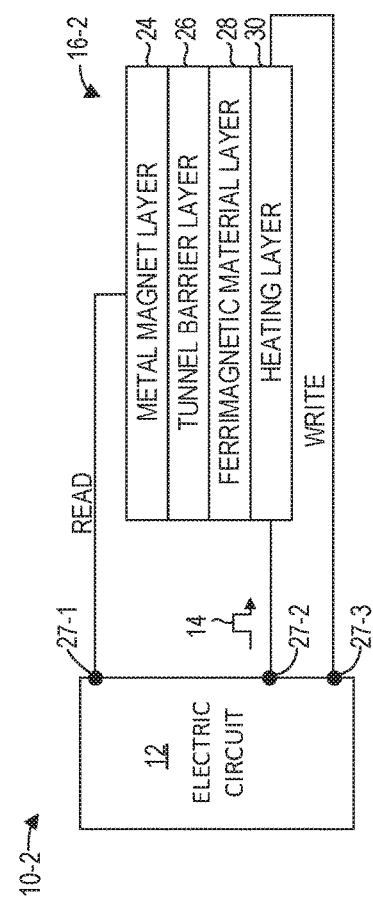
FIG. 3 is a block diagram of a memory circuit according to another embodiment.

FIG. 3 illustrates a memory circuit 10-2 according to another embodiment. The memory circuit 10-2 is substantially similar to the memory circuit 10-1 discussed above with regard to FIG. 2, except as noted herein. The memory circuit 10-2 includes a magnetic memory cell 16-2 that has the metal magnet layer 24, the tunnel barrier layer 26, and the ferrimagnetic material layer 28. The metal magnet layer 24 has a static magnetic direction that is "pinned" such that the magnetic direction of the metal magnet layer 24 does not change. The tunnel barrier layer 26 comprises a thin insulating layer between the metal magnet layer 24 and the ferrimagnetic material layer 28. The metal magnet layer 24 and the tunnel barrier layer 26 may comprise materials utilized in conventional MRAM memory cells. The ferrimagnetic material layer 28 may comprise any of the ferrimagnetic materials discussed above with regard to FIG. 1, including, by way of non-limiting example, a rare-earth transition metal ferrimagnetic material, including alloys, and/or layered films, such as, for example, gadolinium iron cobalt, terbium iron, or terbium cobalt.

In this embodiment, the magnetic memory cell 16-2 includes a heating layer 30. The heating layer 30 may comprise, for example, a metal or metal alloy. In some embodiments, the metal or metal alloy has a density less than or equal to 9 grams/centimeter$^3$. In some embodiments, the metal or metal alloy comprises one of copper, aluminum, magnesium, or titanium. The heating layer 30 is thermally coupled to the ferrimagnetic material layer 28. The electric circuit 12 has three terminals 27-1, 27-2, and 27-3, and is electrically coupled via the terminals 27-2 and 27-3 to the heating layer 30 rather than the ferrimagnetic material layer 28. The electric circuit 12 sends the electric current pulse 14 through the heating layer 30 via the terminals 27-2 and 27-3. Again, in this embodiment, the electric current pulse 14 may be sent in either direction through the ferrimagnetic material layer 28, such as in a direction from the terminal 27-2 to the terminal 27-3, or from the terminal 27-3 to the terminal 27-2. The electric current pulse 14 through the heating layer 30 causes the ferrimagnetic material layer 28 to heat and to toggle the magnetic direction of the ferrimagnetic material layer 28 from the first magnetic direction to the second magnetic direction.

Similar to a conventional MRAM cell, the electric circuit 12 can determine the current magnetic direction of the ferrimagnetic material layer 28, and thus the value of the magnetic memory cell 16-1, based on an electrical resistance between the terminals 27-1 and 27-2.

Note that in each of the magnetic memory cell 16, the magnetic memory cell 16-1, and the magnetic memory cell 16-2 no spin polarization is required to toggle the magnetic direction of the ferrimagnetic material layer 28 from one magnetic direction to the other magnetic direction.

Figure 4:
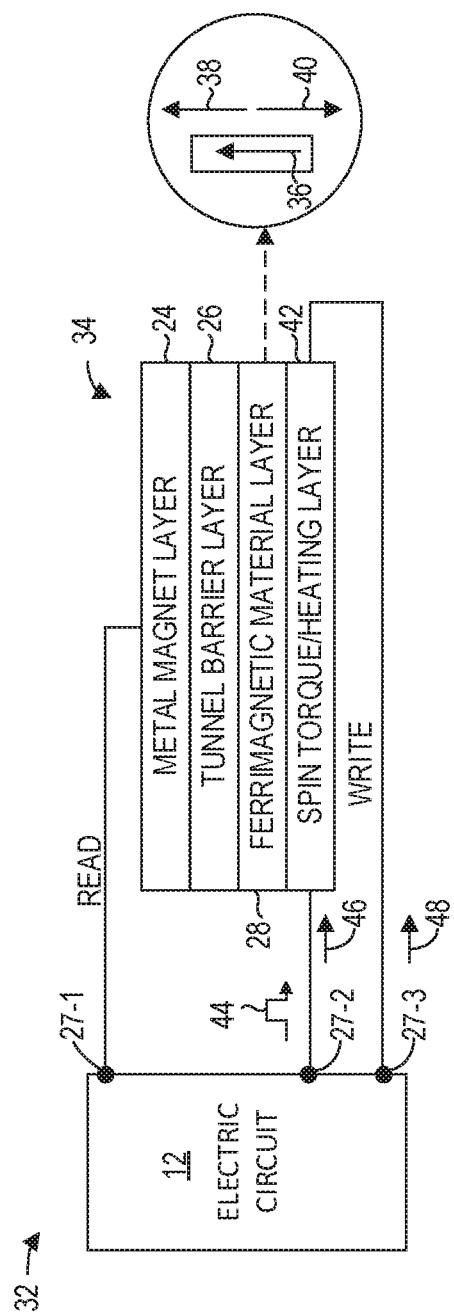
FIG. 4 is a block diagram of a memory circuit according to another embodiment.

However, in another embodiment, spin torque may be utilized to quickly set the magnetic direction of a memory cell to a desired magnetic direction. In this regard, FIG. 4 is a block diagram of a memory circuit 32 according to another embodiment. In this embodiment, the memory circuit 32 includes a magnetic memory cell 34 that includes the metal magnet layer 24, the tunnel barrier layer 26, and the ferrimagnetic material layer 28 substantially similar to, or identical to, the metal magnet layer 24, the tunnel barrier layer 26 and the ferrimagnetic material layer 28 discussed above with regard to FIGS. 2 and 3. The ferrimagnetic material layer 28 has a magnetic direction 36 that may point in a first direction 38 or a second direction 40.

The magnetic memory cell 34 also includes a spin-torque/heating layer 42 (hereinafter, spin-torque layer 42) that is thermally and magnetically coupled to the ferrimagnetic material layer 28. The spin-torque layer 42 is configured to, in response to an electric current pulse 44, generate a magnetic torque, such as via spin-transfer torque or spin-orbit torque mechanisms. The direction of the magnetic torque is based on the direction (i.e., polarity) of the electric current pulse 44. Thus, if the electric circuit 12 sends the electric current pulse 44 in a direction 46 (i.e., from the terminal 27-2 to the terminal 27-3) through the spin-torque layer 42, the direction of the generated magnetic torque is opposite to the direction of the generated magnetic torque if the electric circuit 12 sends the electric current pulse 44 in a direction 48 (i.e., from terminal 27-3 to terminal 27-2) through the spin-torque layer 42.

The direction of the magnetic torque generated by the spin-torque layer 42, in combination with the heat transferred to the ferrimagnetic material layer 28, sets the magnetic direction 36 to a desired magnetic direction. For example, to set the magnetic direction 36 of the ferrimagnetic material layer 28 to the first direction 38, the electric circuit 12 may send the electric current pulse 44 in the direction 46 through the spin-torque layer 42. To set the magnetic direction 36 of the ferrimagnetic material layer 28 to the second direction 40, the electric circuit 12 may send the electric current pulse 44 in the direction 48 through the spin-torque layer 42.

The electric current pulse 44 has the same characteristics as the electric current pulse 14 discussed above. For example, the electric current pulse 44 may be a pulse of about 50 ps at full width half maximum (FWHM), or about 20 ps FWHM, or about 10 ps FWHM, or any duration between about 0.1 ps and 50 ps. In some embodiments the electric current pulse 44 may have a current density up to about $10^9$ A/cm$^2$. In some embodiments, the electric current pulse 44 deposits about 1.4 mJ/cm$^2$ into the magnetic memory cell 34. In some embodiments, the electric current pulse duration may be longer than 50 ps, and the current density lower.

The spin-torque layer 42 may comprise, for example, a relatively heavy-element metal, such as, by way of non-limiting example, platinum, palladium, tantalum, tungsten, and/or alloys of such metals.

Similar to a conventional MRAM cell, the electric circuit 12 can determine the current magnetic direction of the ferrimagnetic material layer 28, and thus the value of the magnetic memory cell 34, based on an electrical resistance between the terminals 27-1 and 27-2.

Figure 5A:
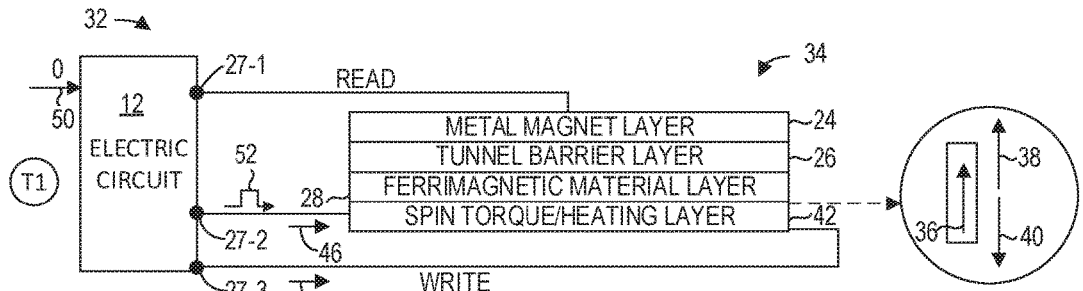
FIGS. 5A-5D are block diagrams of a memory circuit at four successive periods of time according to one embodiment.
Figure 5B:
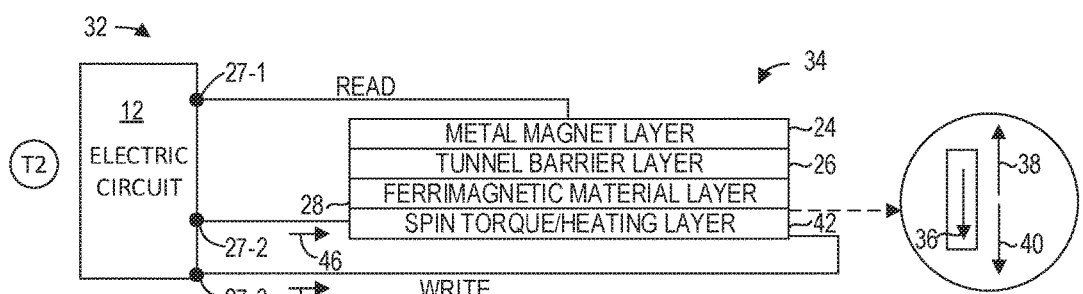
Figure 5C:
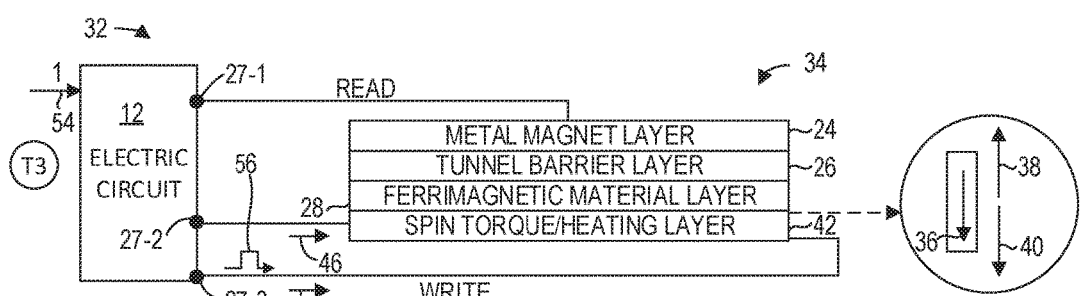
Figure 5D:
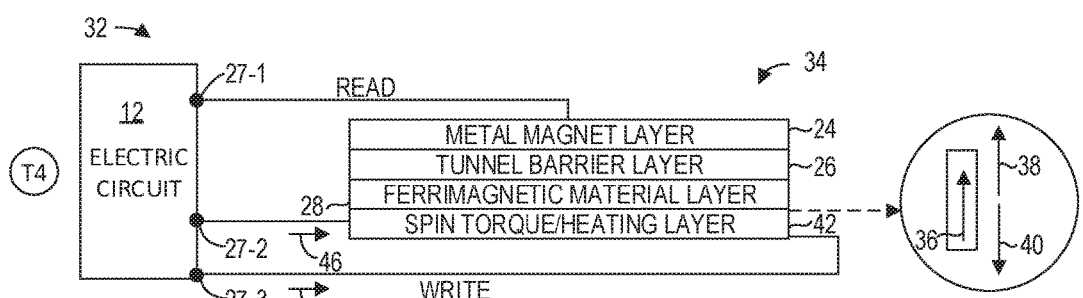

FIGS. 5A-5D illustrate the memory circuit 32 at four successive periods of time. Referring first to FIG. 5A, at a time T1, the electric circuit 12 receives an instruction 50 to set the magnetic memory cell 34 to a value of zero. The instruction 50 may comprise, for example, a signal at a particular voltage level. The electric circuit 12 generates an electric current pulse 52 and sends the electric current pulse 52 through the spin torque/heating layer 42 along the direction 46 (i.e., from terminal 27-2 to 27-3). The electric current pulse 52 may be a pulse of about 50 ps at full width half maximum (FWHM), or about 20 ps FWHM, or about 10 ps FWHM, or any duration between about 0.1 ps and 50 ps.

In some embodiments, the electric current pulse 52 may have a current density up to about $10^9$ A/cm$^2$.

At the time T2, immediately after the electric current pulse 52 travels through the spin-torque layer 42 in the direction 46, the magnetic direction 36 of the magnetic memory cell 34 points in the second direction 40, representing a value of zero. Note that even if at time T1 the magnetic direction 36 of the magnetic memory cell 34 pointed in the second direction 40, the magnetic direction 36 of the magnetic memory cell 34 would still point in the second direction 40 after the sending of the electric current pulse 52 due to the magnetic torque direction generated by the spin-torque layer 42.

At a time T3, the electric circuit 12 receives an instruction 54 to set the magnetic memory cell 34 to a value of one. The instruction 54 may comprise, for example, a signal at a particular voltage level. The electric circuit 12 generates an electric current pulse 56 and sends the electric current pulse 56 through the spin-torque layer 42 along the direction 48 (i.e., from terminal 27-3 to 27-2). The electric current pulse 56 may be a pulse of about 50 ps at full width half maximum (FWHM), or about 20 ps FWHM, or about 10 ps FWHM, or any duration between about 0.1 ps and 50 ps. In some embodiments, the electric current pulse 56 may have a current density up to about $10^9$ A/cm$^2$. Note that time T3 may be a short interval after time T1, such as 5 ps to 50 ps later, due to the ultrashort switching time of the magnetization of the ferrimagnetic material layer 28 facilitated by the embodiments herein.

At the time T4, immediately after the electric current pulse 56 travels through the spin-torque layer 42 in the direction 48, the magnetic direction 36 of the magnetic memory cell 34 points in the first direction 38, representing a value of one.

The electric circuit 12 may subsequently receive another instruction to identify the value of the memory cell 34. The electric circuit 12 tests the resistance between the terminal 27-1 and the terminal 27-2, and determines that the magnetic direction 36 points in the direction 38. Based on the magnetic direction 36 pointing in the first direction 38, the electric circuit 12 identifies the value of the memory cell 34 as one.

Figure 6:
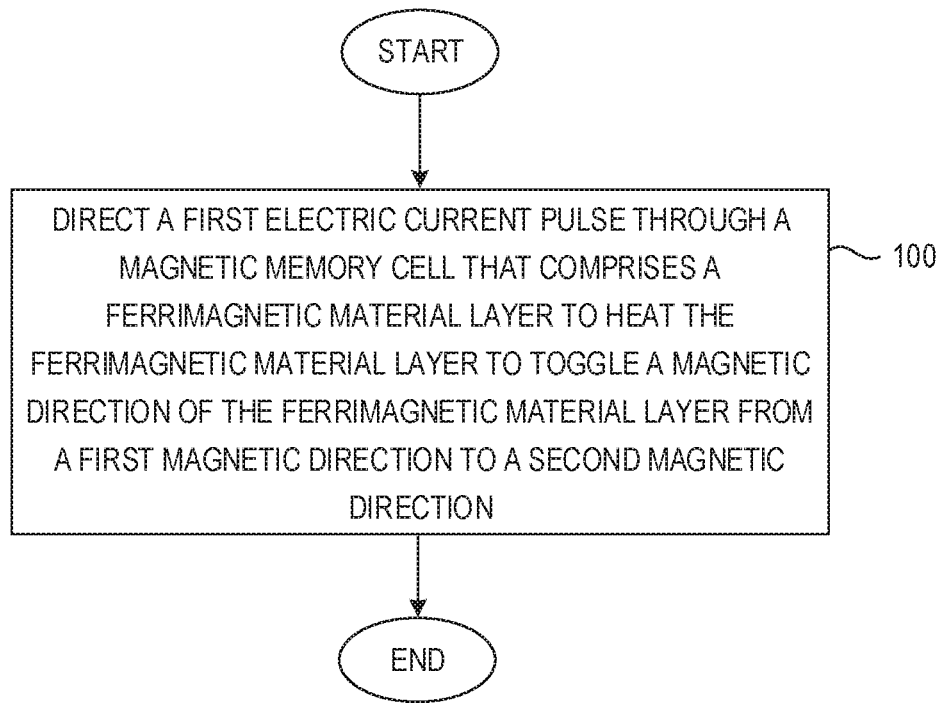
FIG. 6 is a flowchart of a method for altering a magnetic direction associated with a magnetic memory cell according to one embodiment.

FIG. 6 is a flowchart of a method for altering a magnetic direction associated with a magnetic memory cell according to one embodiment. FIG. 6 will be discussed in conjunction with FIGS. 2 and 3. The electric circuit 12 directs a first electric current pulse 14 through the magnetic memory cell 16-1, 16-2 that comprises the ferrimagnetic material layer 28 to heat the ferrimagnetic material layer 28 to toggle a magnetic direction of the ferrimagnetic material layer 28 from a first magnetic direction to a second magnetic direction (block 100). In the embodiment illustrated in FIG. 2, the first electric current pulse 14 is sent through the ferrimagnetic material layer 28. In the embodiment illustrated in FIG. 3, the first electric current pulse 14 is sent through the heating layer 30 that is thermally coupled to the ferrimagnetic material layer 28.

Figure 7:
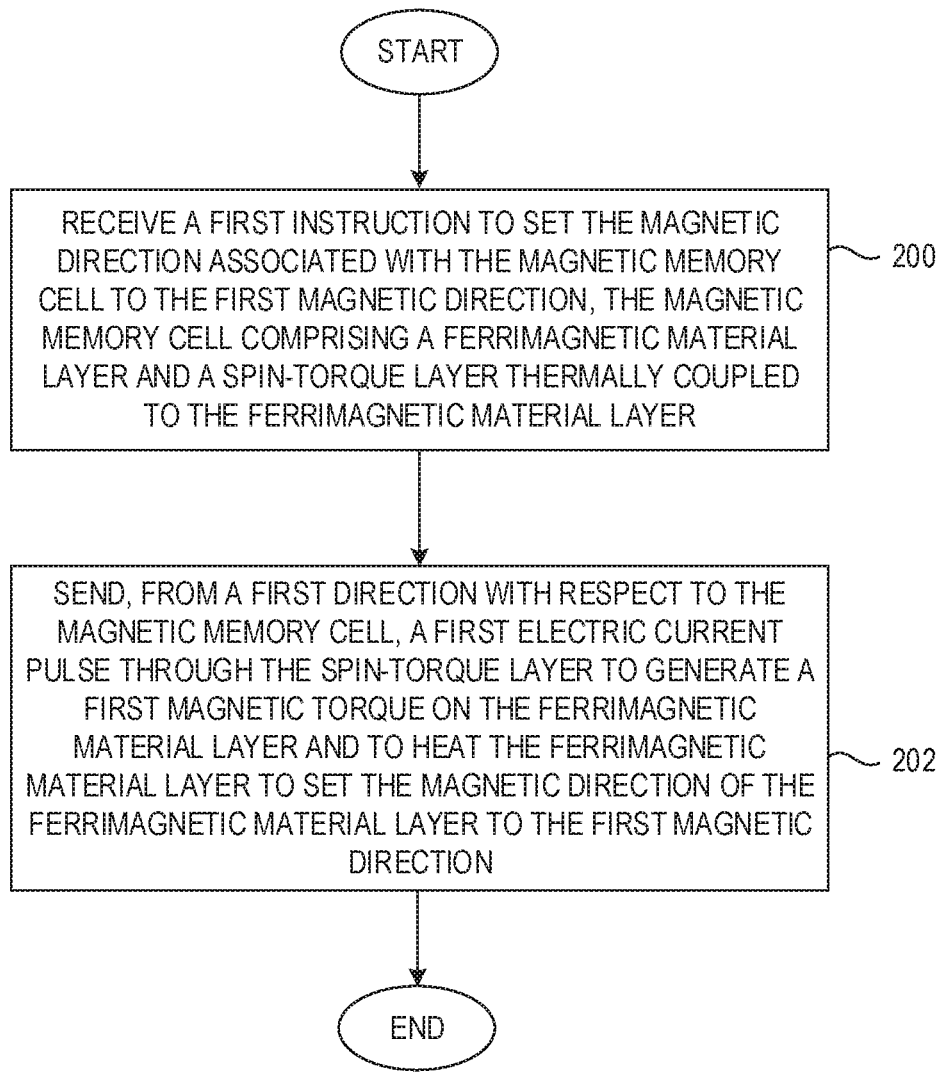
FIG. 7 is a flowchart of a method for setting a magnetic direction associated with a magnetic memory cell to a first magnetic direction or a second magnetic direction, according to one embodiment.

FIG. 7 is a flowchart of a method for setting a magnetic direction associated with a magnetic memory cell to a first magnetic direction or a second magnetic direction, according to one embodiment. FIG. 7 will be discussed in conjunction with FIG. 4. The electric circuit 12 receives a first instruction to set the magnetic direction 36 associated with the magnetic memory cell 34 to the first direction 38. The magnetic memory cell 34 includes the ferrimagnetic material layer 28 and the spin-torque layer 42 thermally coupled to the ferrimagnetic material layer 28 (block 200).

The electric circuit 12 sends, from the direction 48 with respect to the magnetic memory cell 34, an electric current pulse through the spin-torque layer 42 to generate a first magnetic torque on the ferrimagnetic material layer 28 and to heat the ferrimagnetic material layer 28 to set the magnetic direction 36 of the ferrimagnetic material layer 28 to the first direction 38 (block 202).

Experimental Results

In one experiment, the magnetic response of a Ta(5 nm)/$Gd_{30}Fe_{63}Co_7$(20 nm)/Pt(5 nm) multilayer was studied. The film presented perpendicular magnetic anisotropy with a coercivity of 80 Oe at room temperature. The compensation temperature, i.e. the temperature where the net moment is minimized in ferrimagnets, was approximately 270 K. Initially, magnetization characteristics associated with all-optical switching were determined. Upon irradiation by a sequence of single laser pulses, the magnetization of the GdFeCo film toggles after each pulse. All-optical switching (AOS) ability at different laser pulse durations was determined. The GdFeCo film switched with laser pulse durations between 60 fs (FWHM) and 10 ps.

The response of the GdFeCo film to electrical pulses was then determined. The magnetization of the GdFeCo section toggles after each electrical pulse, similar to AOS switching. The switching behavior is driven by transient heating of the electrons.

Time resolved magneto-optic Kerr effect (MOKE) measurements were performed in order to temporally resolve the switching dynamics following the arrival of an electrical pulse. For electrical pulses with an absorbed energy density in the GdFeCo section less than 0.8 mJ/$cm^2$ (with reference to the surface area), the MOKE signal (primarily indicative of the FeCo sublattice magnetization) showed demagnetization within 20 ps, followed by a recovery to the initial magnetization state on longer time-scales. With increased current pulse amplitude, the FeCo demagnetization is larger. For electrical pulses with an absorbed energy density greater than 1.3 mJ/$cm^2$, the magnetic moment of the FeCo sublattice reverses within approximately 10 ps of the electrical pulse arrival at the GdFeCo film. Following reversal, the FeCo magnetization recovers rapidly towards the opposite direction. It reaches 70% of saturation within just 30 ps. The non-monotonic evolution of the magnetization in this experiment, e.g. the decreasing of magnetization at approximately 40 ps, is likely due to the arrival of several low amplitude electrical pulses that arise from reflections of the initial pulse from various electrical discontinuities in the testing structure.

For comparison, time-resolved AOS experiments on the same material were performed. Optical pulses with a FWHM of either 1 ps or 6.4 ps were used. The latter pulse duration is equivalent to the duration of electrical heating from a 9 picosecond electrical pulse because Joule heating is proportional to square of the current. The 1 ps optical pulses switched the magnetization in about 4 ps. Both the 6.4 ps optical pulse and the 9 ps electrical pulse switch the magnetization in about 10 ps. While the time-scale for switching is comparable, significant differences exist between optical and electrical switching. After the magnetization crosses through zero, the recovery of the magnetization in the opposite direction takes hundreds of picoseconds longer for optical vs. electrical switching. This indicates the system reaches a higher equilibrium temperature after optical pulse excitation, given that electrons, spins, and lattice are almost certainly in thermal equilibrium after 50 ps. It was determined that the absorbed critical fluences required for optical switching to be 1.2 mJ/$cm^2$ and 1.6 mJ/$cm^2$ for 1 ps and 6.4 ps durations, respectively. Shorter optical pulses require somewhat less energy to reverse the GdFeCo magnetization. For this experiment, it was determined that the critical energy deposited in the GdFeCo during the electrical switching experiment to be 1.3 mJ/$cm^2$. Therefore, both the time-domain measurements of the magnetization and the estimates of the absorbed fluence indicate that electrical switching of GdFeCo requires less energy than optical switching.

Those skilled in the art will recognize improvements and modifications to the preferred embodiments of the disclosure. All such improvements and modifications are considered within the scope of the concepts disclosed herein and the claims that follow.

What is claimed is:

1. A method for altering a magnetic direction associated with a magnetic memory cell, the method comprising directing a first electric current pulse that has a time duration of less than about 20 picoseconds through the magnetic memory cell that comprises a ferrimagnetic material layer to heat the ferrimagnetic material layer, wherein responsive to the heat a magnetic direction of the ferrimagnetic material layer toggles from a first magnetic direction to a second magnetic direction.

2. The method of claim 1 wherein the first electric current pulse is directed through the ferrimagnetic material layer.

3. The method of claim 1 wherein the first electric current pulse is directed through a heating layer that is thermally coupled to the ferrimagnetic material layer.

4. The method of claim 3 wherein the heating layer comprises a metal or a metal alloy having a density less than or equal to 9 grams/$centimeter^3$.

5. The method of claim 4 wherein the heating layer comprises one of copper, aluminum, magnesium, or titanium, or a combination thereof.

6. The method of claim 1 wherein the first electric current pulse lacks spin polarization.

7. The method of claim 1 wherein the ferrimagnetic material layer comprises a single-layer rare-earth transition metal alloy.

8. The method of claim 1 wherein the ferrimagnetic material layer comprises one of gadolinium iron cobalt, terbium iron, or terbium cobalt.

9. The method of claim 1 wherein the first electric current pulse has a time duration of less than about 10 picoseconds.

10. The method of claim 1 wherein the first electric current pulse has a current density in a range between about $10^8$ A/cm$^2$ and about $10^9$ A/cm$^2$.

11. The method of claim 1 further comprising:
at a time between 5 picoseconds and less than 50 picoseconds subsequent to directing the first electric current pulse through the magnetic memory cell, directing a second electric current pulse through the magnetic memory cell to toggle the magnetic direction of the ferrimagnetic material layer from the second magnetic direction to the first magnetic direction; and
reading out the magnetic memory cell to determine a value of the magnetic memory cell that corresponds to the magnetic direction of the ferrimagnetic material layer.

12. The method of claim 1 further comprising:
receiving a request to set the magnetic memory cell to a value that corresponds to the first magnetic direction;
reading the magnetic memory cell to determine if a current magnetic direction associated with the magnetic memory cell is the first magnetic direction or the second magnetic direction; and
based on determining that the current magnetic direction associated with the magnetic memory cell is the second magnetic direction, directing a second electric current pulse through the magnetic memory cell to toggle the magnetic direction of the ferrimagnetic material layer from the second magnetic direction to the first magnetic direction.

13. A memory circuit comprising:
a magnetic memory cell comprising a ferrimagnetic material layer;
an electric circuit electrically coupled to the magnetic memory cell, the electric circuit configured to generate and direct a first electric current pulse that has a time duration of less than about 20 picoseconds through the magnetic memory cell to heat the ferrimagnetic material layer, wherein responsive to the heat a magnetic direction of the ferrimagnetic material layer toggles from a first magnetic direction to a second magnetic direction.

14. The memory circuit of claim 13 wherein the electric circuit is configured to generate and direct the first electric current pulse through the ferrimagnetic material layer to heat the ferrimagnetic material layer to toggle the magnetic direction of the ferrimagnetic material layer from the first magnetic direction to the second magnetic direction.

15. The memory circuit of claim 13 wherein the magnetic memory cell comprises a heating layer that is thermally coupled to the ferrimagnetic material layer, and wherein the electric circuit is configured to generate and direct the first electric current pulse through the heating layer to heat the ferrimagnetic material layer to toggle the magnetic direction of the ferrimagnetic material layer from the first magnetic direction to the second magnetic direction.

16. The memory circuit of claim 13 wherein the magnetic memory cell further comprises:
a metal magnet layer; and
a tunnel barrier layer between the metal magnet layer and the ferrimagnetic material layer.

17. The memory circuit of claim 15 wherein the metal magnet layer has a static magnetic direction.

18. The memory circuit of claim 13 wherein the ferrimagnetic material layer comprises a single-layer rare-earth transition metal alloy.

19. A method for setting a magnetic direction associated with a magnetic memory cell to a first magnetic direction or a second magnetic direction, comprising:
receiving a first instruction to set the magnetic direction associated with the magnetic memory cell to the first magnetic direction, the magnetic memory cell comprising a ferrimagnetic material layer and a spin-torque layer thermally coupled to the ferrimagnetic material layer; and
sending, from a first direction with respect to the magnetic memory cell, a first electric current pulse through the spin-torque layer to generate a first magnetic torque on the ferrimagnetic material layer and to heat the ferrimagnetic material layer to set a magnetic direction of the ferrimagnetic material layer to the first magnetic direction.

20. The method of claim 19 wherein the first electric current pulse has a time duration of less than about 20 picoseconds.

21. The method of claim 19 wherein the first electric current pulse has a time duration of less than about 10 picoseconds.

22. The method of claim 19 wherein the first electric current pulse has a current density in a range between about $10^8$ A/cm$^2$ and about $10^9$ A/cm$^2$.

23. The method of claim 19 further comprising:
receiving a second instruction to set the magnetic direction associated with the magnetic memory cell to the second magnetic direction; and
sending, from a second direction with respect to the magnetic memory cell, a second electric current pulse through the spin-torque layer to generate a second magnetic torque on the ferrimagnetic material layer and to heat the ferrimagnetic material layer to set the magnetic direction of the ferrimagnetic material layer to the second magnetic direction.

24. The method of claim 23 wherein the second electric current pulse is sent less than 50 picoseconds after sending the first electric current pulse.

25. A memory circuit comprising:
a magnetic memory cell comprising a ferrimagnetic material layer having a magnetic direction;
a spin-torque layer thermally coupled to the ferrimagnetic material layer; and
an electric circuit electrically coupled to the spin-torque layer, the electric circuit configured to generate and send an electric current pulse through the spin-torque layer from a particular direction with respect to the magnetic memory cell to generate a magnetic torque on the ferrimagnetic material layer and to heat the ferrimagnetic material layer to set the magnetic direction of the ferrimagnetic material layer to a desired magnetic direction.

26. The memory circuit of claim 25 wherein the spin-torque layer comprises at least one of platinum, palladium, tantalum, tungsten, and/or alloys thereof.

27. The memory circuit of claim 25 wherein the magnetic memory cell further comprises:
a metal magnet layer; and
a tunnel barrier layer between the metal magnet layer and the ferrimagnetic material layer.

28. A method for altering a magnetic direction associated with a magnetic memory cell, the method comprising directing a first electric current pulse through the magnetic memory cell that comprises a ferrimagnetic material layer and a heating layer thermally coupled to the ferrimagnetic material layer to heat the ferrimagnetic material layer, wherein responsive to the heat a magnetic direction of the ferrimagnetic material layer toggles from a first magnetic direction to a second magnetic direction, wherein the first electric current pulse is directed through the heating layer and the heating layer comprises a metal or a metal alloy having a density less than or equal to 9 grams/centimeter$^3$.

29. A memory circuit comprising:
   a magnetic memory cell comprising a ferrimagnetic material layer and a heating layer comprising a metal or a metal alloy having a density less than or equal to 9 grams/centimeter$^3$, the heating layer being thermally coupled to the ferrimagnetic material layer; and
   an electric circuit electrically coupled to the magnetic memory cell, the electric circuit configured to generate and direct a first electric current pulse through the heating layer of the magnetic memory cell to heat the ferrimagnetic material layer, wherein responsive to the heat a magnetic direction of the ferrimagnetic material layer toggles from a first magnetic direction to a second magnetic direction.

* * * * *

UNITED STATES PATENT AND TRADEMARK OFFICE
CERTIFICATE OF CORRECTION

PATENT NO. : 10,388,349 B2
APPLICATION NO. : 15/711726
DATED : August 20, 2019
INVENTOR(S) : Yang Yang et al.

Page 1 of 1

It is certified that error appears in the above-identified patent and that said Letters Patent is hereby corrected as shown below:

In the Claims

In Column 11, Line 63, replace "The memory circuit of claim 15" with --The memory circuit of claim 16--.

Signed and Sealed this
Nineteenth Day of November, 2019

Andrei Iancu
*Director of the United States Patent and Trademark Office*